United States Patent
Guggenmos et al.

(10) Patent No.: US 8,364,320 B2
(45) Date of Patent: Jan. 29, 2013

(54) METHOD FOR THE HIGHLY PRECISE REGULATION OF LOAD-VARIABLE HEAT SOURCES OR HEAT SINKS, AND DEVICE FOR CONTROLLING THE TEMPERATURE OF A DYNAMIC HEAT SOURCE, ESPECIALLY PUMP DIODES FOR SOLID-STATE LASERS

(75) Inventors: Markus Guggenmos, Schwandorf (DE); Martin Hartmann, Burgthann (DE)

(73) Assignee: Arges Gesellschaft für Industrieplanung und Lasertechnik M.B.H., Wackersdorf (DE)

( * ) Notice: Subject to any disclaimer, the term of this patent is extended or adjusted under 35 U.S.C. 154(b) by 833 days.

(21) Appl. No.: 12/227,477

(22) PCT Filed: May 9, 2007

(86) PCT No.: PCT/EP2007/054504
§ 371 (c)(1),
(2), (4) Date: Aug. 19, 2009

(87) PCT Pub. No.: WO2007/134969
PCT Pub. Date: Nov. 29, 2007

(65) Prior Publication Data
US 2009/0306831 A1    Dec. 10, 2009

(30) Foreign Application Priority Data
May 19, 2006  (DE) .......................... 10 2006 023 615

(51) Int. Cl.
*G05D 11/00* (2006.01)
(52) U.S. Cl. ........................ 700/282; 700/166
(58) Field of Classification Search .................. 700/166, 700/282, 292, 299; 219/121.6, 121.62, 121.81, 219/121.83
See application file for complete search history.

(56) References Cited

U.S. PATENT DOCUMENTS

| 2003/0043867 | A1* | 3/2003 | Huber et al. ..................... 372/34 |
| 2003/0127526 | A1* | 7/2003 | Sasayama et al. ......... 236/12.12 |

(Continued)

FOREIGN PATENT DOCUMENTS

| EP | 0987799 | 3/2000 |
| WO | WO 00/77456 | 12/2000 |

OTHER PUBLICATIONS

Publisher: Elsevier B.V. Author: Mohamed S. El-Genk and Jean-Michel Tournier Title: DynMo-TE: Dynamic simulation model of space reactor power system with thermoelectric converters Relevant pp. 2501-2529 Date of Publication (Month/Year): Dec. 2006 Place of Publication (Name of journal or magazine): Nuclear Engineering and Design, vol. 236, Issue 23.

(Continued)

*Primary Examiner* — John R. Cottingham
*Assistant Examiner* — Chad Rapp
(74) *Attorney, Agent, or Firm* — Gerald T. Bodner

(57) ABSTRACT

The invention relates to a method for the highly precise regulation of load-variable heat sources or heat sinks, and to a device for controlling the temperature of a dynamic heat source, especially of pump diodes for solid-state lasers. According to said method, the calculated mean value of the forward flow temperature and the return flow temperature is preset as an actual value for regulating the power, in order to ensure a stabilization of the heat source even without any information on the type of thermal load and the heat quantity to be dissipated, by the mean reference temperature for the heat flow to or from the temperature-controlling medium being maintained at a constant value irrespective of the heat quantity to be dissipated. As far as the device is concerned, a return flow temperature measuring device is provided in addition to a forward flow temperature measuring device arranged in the pump diode coolant circuit, both measuring devices being connected to an analog or digital computing unit which performs a mean value calculation in order to determine a refrigerating capacity set value transmitted to corresponding switching devices for the regulation of the load.

23 Claims, 1 Drawing Sheet

U.S. PATENT DOCUMENTS

Figure 1:
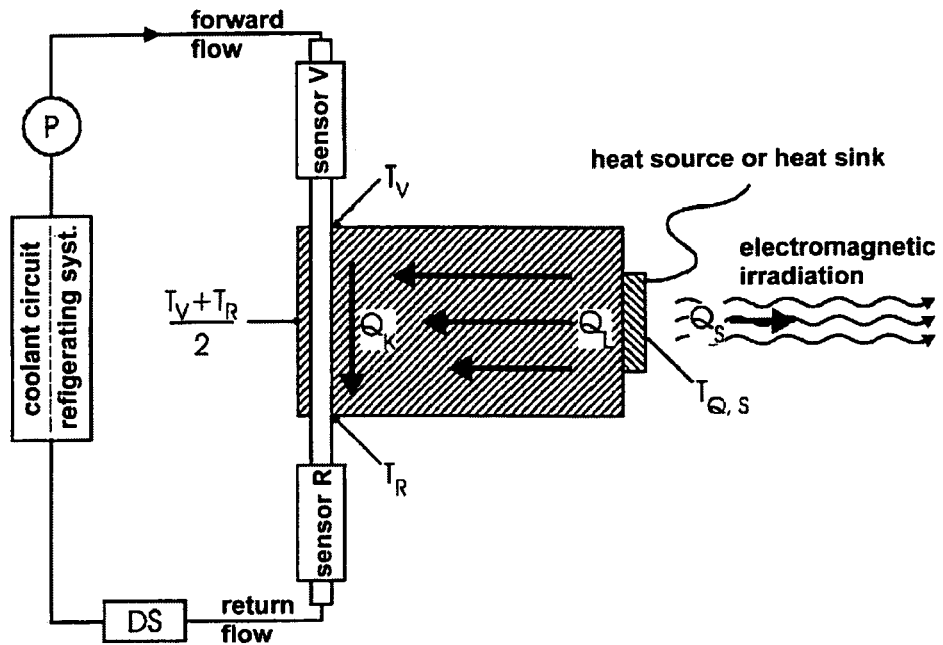

2003/0198264 A1* 10/2003 Vetrovec et al. ............... 372/35
2005/0205241 A1* 9/2005 Goodson et al. ............. 165/80.4

OTHER PUBLICATIONS

Publisher: The International Bureau of the World Intellectual Property Organization Author: Yoline Cussac Title: Notification of Transmittal of Translation of the International Preliminary Report on Patentability, English translation of the International Preliminary Report on Patentability and English translation of the Written Opinion of the International Searching Authority Relevant pp. 1-9 (unnumbered by WIPO) Date of Publication (Month/Year): Jan. 29, 2009 Place of Publication (Name of journal or magazine): WIPO (Geneva, Switzerland).

El-Genk, et al., *DynMo-TE:Dynamic simulation model of space reactor power system with thermoelectric converters*; Nuclear Engineering and Design, No. 236 (2006); pp. 2501-2529.

* cited by examiner

METHOD FOR THE HIGHLY PRECISE REGULATION OF LOAD-VARIABLE HEAT SOURCES OR HEAT SINKS, AND DEVICE FOR CONTROLLING THE TEMPERATURE OF A DYNAMIC HEAT SOURCE, ESPECIALLY PUMP DIODES FOR SOLID-STATE LASERS

The invention relates to a method for the highly precise regulation of load-variable heat sources or heat sinks, and to a device for controlling the temperature of a dynamic heat source, especially of pump diodes for solid-state lasers according to the preamble of the independent claims.

According to the prior art, exclusively the temperature of the forward flow is kept constant by a regulation device in commercially available cooling or heating devices with liquid media. The return temperature and the flow through the connected load are not taken into account. When the thermal load changes, the heating or cooling performance of the system is adapted to the load conditions by the provided regulation only after a prolonged period of time, i.e. when the coolant within a reservoir has warmed up to such a degree that the forward flow temperature changes. This results in a comparatively slow reaction of the system to an alternating heat introduction by the heat source or heat sink to be temperature-controlled.

Furthermore, in the solutions of the state of the art, the actual temperature depends on the load conditions in that in real systems, the heat source or heat sink is not temperature-controlled directly by the cooling medium itself, but additional heat transfer resistances are present between the heat source/sink and the temperature-controlled media. Due to that, the temperature at the heat source or heat sink will change in a load-dependent manner while the flow temperature is constant.

Devices for controlling the temperature of pump diodes for solid-state lasers belong to the known state of the art. In such known laser cooling systems usually only the forward flow temperature is regulated or pre-defined as a set value. The return temperature thereby depends on the input quantity of heat and the heat flow, i.e. on the coolant flowing per unit of time. Further dependencies occur due to cross-sectional changes, e.g. by depositions in the coolant circuit.

In solid-state lasers pumped by semiconductor diodes, a precise adaptation of the emission wavelength of the pump diodes to the pump bands of the laser crystal is one of the decisive parameters for optimizing the overall laser efficiency. For example, a pump band from 805 nm to 809 nm of the Nd:YAG crystal is in the range of the emission wavelength of gallium arsenide diodes, the highest efficiency of the laser system being reached at a pump wavelength of 808 nm.

Since the emitted wavelength in pump diodes displaces by about 0.25 nm/K as a function of temperature, a precise control of the emitter temperature is indispensable for a high output constancy of the Nd:YAG laser.

The dependence of the wavelength on the temperature expresses itself, for example, in that a laser diode having a factory specification of 810 nm/25° C. actually reaches its optimum wavelength range for excitation of 808 nm at 17° C. Hence, it is necessary to pre-define and set the precise pump diode temperature for a maximum efficiency by an accurately regulated cooling tailored to demand.

Further difficulties with respect to the desired precise pump diode temperature setting reside in that the used laser diodes basically exhibit different diode-specific wavelengths as a consequence of variances during the manufacturing process. If several of such laser diodes are used for pumping, the pumping light will also contain spectral wavelength portions which only can be used with a low efficiency for exciting the laser crystal.

From the above-mentioned it is therefore an object of the invention to propose an improved method for the highly precise regulation of load-variable heat sources or heat sinks, and an associated device for controlling the temperature, wherein a high regulation accuracy is ensured with a corresponding quick response characteristic so that an optimized heating and cooling management can be reached in toto.

The achievement of the object of the invention is realized by a method according to the teaching of claim 1 and a device according to the feature combination as per claim 4, the subclaims representing at least appropriate embodiments and improvements.

In a first method-related realization of the teaching according to the invention, a calculated mean value of the forward flow temperature and the return flow temperature is used as an actual value for regulation. Hereby, the stabilisation of the heat source may be improved without additional information on the type of thermal load and the heat quantity to be dissipated.

An advantage arises from the fact that the mean reference temperature $T_M = \frac{1}{2} \cdot (T_V + T_R)$ for the heat flow $Q_L$ is maintained at a constant value irrespective of the heat quantity to be dissipated. Thus, an increase in the heat flow to the actual cooling device will automatically result in a decrease of the forward flow temperature. Since during a change of load the return flow temperature will change faster than the reservoir temperature, the regulation, as well, will respond faster in the desired manner. In the proposed mean value regulation, the heat transfer resistance between the heat source (e.g. a laser diode) and a heat sink (e.g. the cooling water) is not yet taken into account. This means in a real application that the temperature of the heat source will still increase linearly and as a function of load with an increasing heat flow. If the heat resistance between the heat source and the heat sink is known, then this may be taken into account according to the method when the heat flow, i.e. the cooling power into the cooler is subjected to a metrological detection.

In a further method-related idea, a mean value-regulation is used taking into account the actual heat flow through the temperature-controlling device.

Using a flow sensor and from the measurement values of forward flow temperature $T_V$ and return flow temperature $T_R$, the cooling power (heat flow) $Q_K = (T_V - T_R) \cdot V dt \cdot k$ of the cooling device may be determined. Here, Vdt represents the volume flow.

Since in the stationary-case, the sum of all heat flows in a closed system will be zero with unchanging temperatures, it is considered that with the radiation losses $Q_S$ being neglected, the heat efficiency output by the heat source will be equal to the cooling efficiency of the cooling device, i.e. $Q_K = Q_L$. A temperature difference in proportion to the heat flow hence results for a constant thermal conductance resistance $R_{WL}$ between the heat source and the cooling circuit. As a reversal conclusion, a correction value for the mean reference temperature $T_M$ may be calculated for each heat flow with consideration of the thermal conductance resistance $R_{WL}$, and this mean reference temperature $T_M$ has to be set so as to maintain the temperature of the load $T_{Q,S}$ constant under the measured load conditions. If in practice it is not possible to determine the heat resistance directly between heat source and heat sink, then, due to the linear correlations, the heat transfer resistance needed for the model calculation may be determined empirically by manually optimizing the system at two operating points, e.g. at a load of 40% and at a load of 90%.

A further method-related realization of the invention consists in the mean value regulation with consideration of the actual heat flow by the temperature-controlling device and the disturbance variable $Q_S$.

In the case of a laser diode to be temperature-controlled, it is necessary, with great demands on the regulation accuracy, that the heat flow through the irradiation of electromagnetic radiation be taken into account in the model. The heat flow due to optical irradiation namely may amount up-to-40% of the input electrical power. This consideration of characteristics may either take place in the model on a computational basis, or there is the possibility to detect the optical radiation power as an additional parameter on a metrological basis. Here, the advantage arises that an ageing of the laser diode may be compensated automatically, since the efficiency of the diode will degrade with ageing and the relation between the electrical input power and the optical output power will shift. With a corresponding characteristic representation this will be equivalent to a decrease of the straight-line gradient.

The method-related, as well as the basic idea of the invention embodied in the device may be summarized at this point in that for a precise regulation of a laser beam source temperature the return flow temperature is detected as well as the cooling circuit forward flow temperature in order to build up a mean value regulation on this basis, which optionally takes into account the actual heat flow and/or several disturbance variables in the regulation on a model-basis. This may be realized by means of correction factors intended to shift the mentioned mean value in proportion to the difference of the forward and return flows.

As a result of examinations conducted, it surprisingly turned out, that the detection of absolute temperatures in the forward and return flows is primarily not important, but rather the gradient, i.e. the temperature difference between the forward and return flows, is important. If the gradients present here are detected during the operation of the laser, it is possible to react extraordinarily fast on a control engineering basis, so that the temperature variance across a spatial expansion of an existing cooling block on which a pre-defined number of pump diodes are located, may be maintained low compared to the state of the art. Thereby, the possibility results in the end that individual pump diodes be maintained in a temperature regime which is suited for an optimal excitation, in particular for high-power applications. The device for controlling the temperature of pump diodes for a solid-state laser, which are arranged on a cooling block, accordingly possesses a forward flow temperature measuring device in the pump diode coolant circuit, and in addition a temperature measuring device arranged in the return flow. As an option, a through-flow measuring device for the coolant may be used to determine the actual heat flow.

The forward and return flow measuring devices are connected to a computing unit, which even may be analog, and which performs the already mentioned mean value calculation in order to determine a refrigerating capacity set value transmitted to corresponding switching devices or valves for the regulation of the power, which are present in the coolant circuit.

The forward flow and/or return flow temperature measuring device may be configured in one embodiment as a temperature difference sensor.

The coolant circuit may be provided with a flow sensor for determining the heat flow from the temperature difference and the forward or return flow temperature. The heat transition between the pump diodes and the material of a pump diode cooling block is determined on a refrigerant-specific basis, and this value is input into the computing unit as a correction factor K1. The diode specific heat irradiation over the respective pump performance is likewise determined. This dependency is then input into the computing unit as a second correction value K2 or as a correction function f(K2).

As a function of the respective current mean values and the power turnover directly resulting from these, the computing unit will transmit a control signal to the circulating pump in the coolant circuit.

Optionally, there is the possibility to provide a heating device in a coolant reservoir present within the coolant circuit so as to request a nearly constant cooling power from the coolant circuit even at per se different requirements originating from the actual laser.

In the following, the invention will be explained in more detail in terms of exemplary embodiments and with reference to figures.

Figure 2:
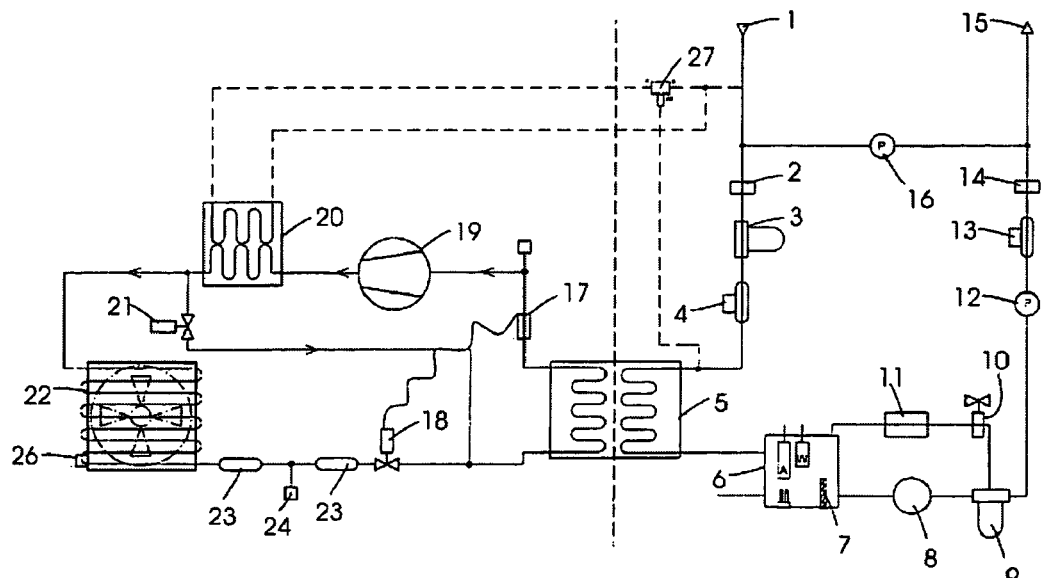

FIG. 1 shows a schematic representation for the understanding of the model view of the regulation method according to the invention, and FIG. 2 shows a schematic representation of a device for controlling the temperature, comprising a pump diode coolant circuit (water circuit) and a cooling circuit.

The representation according to FIG. 1, namely the model of a fluid-controlled system with radiation losses, shows a heat source or heat sink with outlined electromagnetic radiation.

This heat source may comprise one laser diode or a set of laser diodes. $T_{Q,S}$ designates the actual temperature of the heat source or heat sink. $Q_S$ represents the heat flow due to electromagnet-irradiation or radiation and further disturbance variables. $Q_L$ refers to the heat flow to/from the temperature-controlling medium, and $Q_K$ refers to the heat flow of the cooler. Corresponding temperature sensors are present in the forward and return flows.

The following physical correlations apply as far as the model representation is concerned:

The sum of all heat flows of the entire system is zero in the static case; i.e. $Q_K+Q_L+Q_S=0$.

The heat flow of the cooler circuit is determined by the product of the temperature difference $T_V-T_R$ and the flow rate of the medium, as well as the heat capacity k of the medium, i.e. $Q_K \sim (T_V-T_R) \cdot V dt \cdot k$.

The heat flow $Q_L$ from or into the heat sink is proportional to the temperature difference $T_{QS}-T_M$ and the thermal conductivity resistance $R_{WL}$ between heat source/heat sink and the temperature-controlling circuit, i.e. $Q_L \sim T_{QS}-(T_V-T_R)/2 \cdot R_{WL}$.

A disturbance variable $Q_S$ may increase or decrease the heat flow of $Q_L$, and may either be neglected as a constant, may be described by a characteristic or may be, metrologically detected.

With these fundamental considerations in mind, various steps may be realized with respect to the accuracy of temperature-controlling a load.

Firstly, there is the possibility of the regulation stabilizing the computational mean value of the temperature which is obtained from the sensors for the forward and return flow temperatures. Here, the advantage arises that without any additional information on the type of load, a stabilization of the load temperature is possible, since the mean reference temperature $T_M$ for the heat flow $Q_L$ is maintained at a constant value irrespective of the load.

By means of a flow sensor DS and by taking the measurement values $T_V$ and $T_R$ into account, the additional heat flow into or from the temperature-controlling device may be calculated. From the heat flow such determined, a correction value will be calculated for the mean reference temperature $T_M$ with consideration of the heat transfer resistance $R_{WL}$, which is to be set in order to maintain the temperature of the load $T_{Q,S}$ constant under the measured load conditions. The determination of the heat transfer resistance required for the model calculation may, for example, be performed by a manual optimization at two operating points of the system concerned.

A further improvement of the method together with an increase of the regulation accuracy is possible when a dependence on the load is taken into account with respect to the disturbance variable $Q_S$. In the case of an optical transmitting diode, this may be the characteristic radiant power as a function of the electric input power, which is easily detectable by metrology.

FIG. 2 shows a-schematic representation of a device for controlling the temperature at a dynamic heat source, here in particular of pump diodes for solid-state lasers, comprising a pump diode coolant circuit and a refrigerant circuit coupled to this coolant circuit through a heat exchanger. The return flow 1 of the laser, which is not shown in FIG. 2, comprises a temperature sensor 2, e.g. in the form of a thermoelement.

A first water filter 3 and a first flowmeter turbine 4 are connected in series. At the output side of the flowmeter turbine 4, a heat exchanger, e.g. realized in the form of a plate-type evaporator 5, is provided.

This plate-type evaporator 5 is in communication with a coolant reservoir 6.

Apart from various measuring devices, the coolant reservoir 6 comprises a reservoir heating system 7 located inside the reservoir.

On the output side of the reservoir, a circulating pump 8 (designated by P in FIG. 1) is present, which leads to a second water filter 9.

By means of a valve 10 and a fine filter cartridge 11 a bypass may also be connected with respect to a corresponding connection on the water filter 9.

In one embodiment, a pressure sensor 12 is situated downstream of the second filter 9 in the forward flow branch, and downstream of the pressure sensor 12 a second flowmeter turbine 13 is connected.

On the output side of the second flowmeter turbine 13, a-forward flow temperature measuring device 14 is arranged, again preferably realized in the form of a thermoelement.

The forward flow 15 and the return flow 1 may be short-circuited through an overpressure valve 16, which is provided as an option.

The refrigerant circuit modelled according to the state of the art, firstly comprises a cooler 17 departing from the plate-type evaporator 5, which is; intended for a controllable expansion valve 18.

A compressor 19 leads on its output side to a further plate-type evaporator 20, to the output of which a valve 21 is connected, on the one hand, and a condenser block 22 on the other hand.

By means of the valve 21, short-circuit connections from the output of the compressor 19 may be established to the input of the plate-type evaporator 5. The condenser block 22 possesses at its output a drying device 23, downstream of which a pressure guard 24 is connected.

Over a header 25, a connection to the expansion-valve 18 is provided, the output of which in turn leads to the plate-type evaporator 5.

The condenser block 22 comprises a temperature sensor 26 for detecting its temperature.

The plate-type evaporator 20 may be in load-depending communication with the return flow side of the water circuit over a three-way valve 27.

By means of the device described in the exemplary embodiment it is possible to achieve a precise temperature-control of a pumping radiation source and to eliminate disturbance influences, such as those arising in known laser controls, in dependence on the laser power and type of laser.

Since the coupling of the pump diodes to the cooling block, which is not shown in FIG. 2, has an influence on the regulation response, which cannot be neglected, a shift of the mean value is effected on a device-specific or plant-specific basis by the aforementioned correction factor with regard to the method according to the invention, wherein here, as well, changes occurring during a prolonged operation, e.g. due to ageing of the heat transfer material or coupling material, may be taken into account in the regulation scheme.

For purposes of reproducibility, optimized cooling blocks may be used virtually as a standard assembly, wherein for the respective assemblies the coupling quality between the heat sink (cooler) and the heat source (laser diode) is known in advance so as to simplify the mean value shift by means of the correction factor.

LIST OF REFERENCE NUMERALS 1 return flow
2 temperature sensor return flow
3 first water filter
4 first flowmeter turbine
5 plate-type evaporator.
6 coolant reservoir
7 reservoir heating system
8 pump
9 second water filter
10 valve
11 fine filter cartridge
12 pressure sensor
13 second flowmeter turbine
14 temperature sensor (forward) flow
15 forward flow
16 overpressure valve
17 sensor for expansion valve
18 expansion valve
19 compressor
20 plate-type evaporator
21 valve
22 condenser block
23 drying device
24 pressure guard
25 header
26 temperature sensor
27 three-way valve
P pump
DS flow sensor
$T_V$ forward flow temperature.
$T_R$ return flow temperature
$T_M$ mean value $(T_V+T_R)/2$
Vdt volume flow
$Q_K$ heat flow of cooler
$T_{Q,S}$ actual temperature of heat source or heat sink
$Q_L$ heat flow to/from the temperature-controlling medium
$Q_S$ heat flow due to radiation or further disturbance variables

The invention claimed is:

1. A device for controlling the temperature of a dynamic heat source, comprising a pump diode coolant circuit which circulates a temperature-controlling medium, and a refrigerant circuit coupled to this coolant circuit through a heat exchanger, wherein a forward flow temperature measuring device, a circulating pump and switching devices for the regulation of the power are provided within the pump diode coolant circuit, characterized in that a return flow temperature measuring device is arranged within the pump diode coolant circuit, wherein the forward flow temperature measuring device and the return flow temperature measuring device are connected to an analog or digital computing unit which performs a mean value calculation in order to determine a refrigerating capacity set value which is transmitted to the switching devices for the regulation of the power;

and wherein the diode-specific heat irradiation is determined over the respective pump performance, and this dependency is input into the computing unit as a second correction factor K2 or as a correction function f(K2).

2. The device according to claim 1,
characterized in that
the calculated mean value of the forward flow temperature and the return flow temperature is preset as an actual value for regulating the power in order to ensure a stabilization of the heat source even without information on the thermal load and the heat quantity to be dissipated, by a mean reference temperature for the heat flow to or from the temperature-controlling medium being maintained at a constant value irrespective of the heat quantity to be dissipated.

3. The device according to claim 2,
characterized in that
by means of a flow determination, an actual heat flow into or from the temperature-controlling device and the measurement values of forward flow temperature and return flow temperature are calculated in order to determine from these a correction value for the mean reference temperature with consideration of the heat transfer resistance, which represents a default value for maintaining the temperature of the dynamic heat source constant under determined load conditions.

4. The device according to claim 3,
characterized in that
for increasing the regulation accuracy, load-dependent disturbance variables are detected and taken into account in the determination of the default value for the regulation.

5. The device according to claim 1,
characterized in that
at least one of the forward flow temperature measuring device and the return flow temperature measuring device is configured as a temperature difference sensor.

6. The device according to claim 1,
characterized in that
the coolant circuit includes a return flow branch; and
in the refrigerant circuit, a heat exchanger is arranged downstream of a compressor, And this heat exchanger is connected to the return flow branch of the coolant circuit over a three-way valve.

7. The device according to claim 1,
characterized in that
the device further comprises a pump diode cooling block, the pump cooling block being formed from a material; and
the heat transfer between pump diodes and the material of the pump diode cooling block is determined on a device-specific basis and is input into the computing unit as a first correction factor K1.

8. The device according to claim 1,
characterized in that
a flow sensor is provided in the coolant circuit for detecting the medium volume flow.

9. The device according to claim 1,
characterized in that
as a function of the respective current mean value and the power turnover directly resulting from these, the computing unit transmits a control signal to the circulating pump.

10. A device for controlling the temperature of a dynamic heat source, comprising a pump diode coolant circuit which circulates a temperature-controlling medium, and a refrigerant circuit coupled to this coolant circuit through a heat exchanger, wherein a forward flow temperature measuring device, a circulating pump and switching devices for the regulation of the power are provided within the pump diode coolant circuit, characterized in that a return flow temperature measuring device is arranged within the pump diode coolant circuit, wherein the forward flow temperature measuring device and the return flow temperature measuring device are connected to an analog or digital computing unit which performs a mean value calculation in order to determine a refrigerating capacity set value which is transmitted to the switching devices for the regulation of the power;

and wherein as a function of the respective current mean value and the power turnover directly resulting from these, the computing unit transmits a control signal to the circulating pump.

11. The device according to claim 10,
characterized in that
the coolant circuit includes a return flow branch; and
in the refrigerant circuit, a heat exchanger is arranged downstream of a compressor, and this heat exchanger is connected to the return flow branch of the coolant circuit over a three-way valve.

12. The device according to claim 10,
characterized in that
the device further comprises a pump diode cooling block, the pump diode cooling block formed of material; and
the heat transfer between pump diodes and the material of the pump diode cooling block is determined on a device-specific basis and is input into the computing unit as a first correction factor K1.

13. The device according to claim 10,
characterized in that
the diode-specific heat irradiation is determined over the respective pump performance, and this dependency is input into the computing unit as a second correction factor K2 or as a correction function f(K2).

14. The device according to claim 10,
characterized in that
the calculated mean value of the forward flow temperature and the return flow temperature is preset as an actual value for regulating the power in order to ensure a stabilization of the heat source even without information on the thermal load and the heat quantity to be dissipated, by a mean reference temperature for the heat flow to or from the temperature-controlling medium being maintained at a constant value irrespective of the heat quantity to be dissipated.

15. The method according to claim 14,
characterized in that
by means of a flow determination, an actual heat flow into or from the temperature-controlling device and the measurement values of forward flow temperature and return flow temperature are calculated in order to determine from these a correction value for the mean reference temperature with consideration of the heat transfer resistance, which represents a default value for maintaining the temperature of the dynamic heat source constant under determined load conditions.

16. The device according to claim 15,
characterized in that
for increasing the regulation accuracy, load-dependent disturbance variables are detected and taken into account in the determination of the default value for the regulation.

17. The device according to claim 10,
characterized in that
at least one of the forward flow temperature measuring device the return flow temperature measuring device configured as a temperature difference sensor.

18. The device according to claim 10,
characterized in that
a flow sensor is provided in the coolant circuit for detecting the medium volume flow.

19. Method for highly precise regulation of load-variable heat sources provided with a coolant circuit,
comprising a first method step according to which a calculated mean value($T_M$) of the coolant circuit forward flow temperature ($T_V$) and the coolant circuit return flow temperature ($T_R$) is preset as an actual value for regulating the refrigerating capacity, wherein the calculated mean value ($T_M$) is considered as a mean reference temperature for a heat flow ($Q_L$) to the heat source or from the heat source irrespective of a heat quantity to be dissipated and is maintained at a constant value by the regulation of the coolant circuit,
characterized in that
by means of a flow determination of the volume flow of a coolant in the coolant circuit and the coolant circuit forward flow temperature ($T_V$) and return flow temperature ($T_R$) an actual heat flow to the source and from the heat source is calculated in another method step in order to determine from these a correction factor for the means reference temperature with consideration of a heat transmission resistance ($R_{WL}$) between the heat source and the coolant circuit, which represents a default value for allowing to maintain the temperature of the load constant under certain load conditioned by the regulation of the coolant circuit, wherein
for increasing the regulation accuracy, load-dependant disturbance variables ($Q_s$) are detected and taken into account in the determination of the default value for the regulation.

20. Method according to claim 19,
characterized in that
the coolant circuit forward flow temperature and the coolant circuit return flow temperature are detected by measuring devices and the detected temperature values are transferred to an analog or digital computing unit, which performs an averaging in order to determine a refrigerating capacity default value which is transmitted to provide switching devices for the regulation of the refrigerating capacity,
wherein
the heat transfer between pump diodes and a pump diode cooling block provided in the coolant circuit is determined on a device-specific basis and is transferred to the computing unit as a first correction factor (K1).

21. Method according to claim 20,
characterized in that
the pump diode-specific heat radiation is determined over the respective pump performance and this dependency is transferred to the computing unit as a second correction factor (K2) or as a correction function (f(K2)).

22. Method according to claim 20,
characterized in that
as a function of a respective current mean value and the capacity turnover indirectly resulting from therefrom, the computing unit transmits a control signal to a circulating pump located in the coolant circuit.

23. The device according to claim 21,
characterized in that
as a function of the respective current mean value and the capacity turnover indirectly resulting from therefrom, the computing unit transmits a control signal to a circulating pump located in the coolant circuit.

* * * * *